US011269014B2

(12) United States Patent
Oono et al.

(10) Patent No.: US 11,269,014 B2
(45) Date of Patent: Mar. 8, 2022

(54) CHARGEABLE BATTERY ABNORMALITY DETECTION APPARATUS AND CHARGEABLE BATTERY ABNORMALITY DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Akira Oono, Tokyo (JP); Kimiko Fujisawa, Tokyo (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 0 days.

(21) Appl. No.: 16/914,155

(22) Filed: Jun. 26, 2020

(65) Prior Publication Data
US 2020/0326378 A1 Oct. 15, 2020

Related U.S. Application Data

(63) Continuation of application No. PCT/JP2018/047801, filed on Dec. 26, 2018.

(30) Foreign Application Priority Data

Dec. 27, 2017 (JP) .............................. JP2017-250448

(51) Int. Cl.
G01R 31/389 (2019.01)
G01R 31/3835 (2019.01)
(Continued)

(52) U.S. Cl.
CPC ....... G01R 31/389 (2019.01); G01R 31/3648 (2013.01); G01R 31/3835 (2019.01); H01M 10/48 (2013.01); H02J 7/0048 (2020.01)

(58) Field of Classification Search
None
See application file for complete search history.

(56) References Cited

U.S. PATENT DOCUMENTS 5,903,136 A * 5/1999 Takahashi ............. H02J 7/0086
320/128
2011/0254559 A1 * 10/2011 Nakashima ............. B60L 58/12
324/427

(Continued)

FOREIGN PATENT DOCUMENTS

EP 1 293 377 A2 3/2003
JP H06-89743 A 3/1994
(Continued)

OTHER PUBLICATIONS

English translation of Written Opinion (PCT/ISA/237) issued in PCT/JP2018/047801 dated Mar. 2019.
(Continued)

Primary Examiner — Jas A Sanghera
(74) Attorney, Agent, or Firm — Chen Yoshimura LLP

(57) ABSTRACT

A chargeable battery abnormality detection apparatus configured to detect an abnormality of a chargeable battery includes a processor; and a memory storing instructions executable by the processor, wherein the processor performs the following when executing instructions: calculating a value of an internal resistance of the chargeable battery; determining whether the chargeable battery is being charged or being discharged; determining that an abnormality has occurred in the chargeable battery if either one of the following occurs: the calculated value of the internal resistance decreases while the chargeable battery is being discharged; and the calculated value of the internal resistance increases while the chargeable battery is being charged; and outputting a determination result of the abnormality.

19 Claims, 12 Drawing Sheets

(51) Int. Cl.
*H02J 7/00* (2006.01)
*G01R 31/36* (2020.01)
*H01M 10/48* (2006.01)

(56) References Cited

U.S. PATENT DOCUMENTS

2012/0319653 A1* 12/2012 Kumar .................. H02J 7/0026
320/118
2013/0175800 A1* 7/2013 Bluhm .................... H02J 3/381
290/44

FOREIGN PATENT DOCUMENTS

| | | |
|---|---|---|
| JP | 9-134741 A | 5/1997 |
| JP | 2002-313435 A | 10/2002 |
| JP | 2013-96752 A | 5/2013 |
| JP | 2016-125932 A | 7/2016 |

OTHER PUBLICATIONS

European Search Report dated Dec. 11, 2020, in a counterpart European patent application No. 18896407.6.
International Search Report (ISR) issued in PCT/JP2018/047801 dated Mar. 2019.
Written Opinion (PCT/ISA/237) issued in PCT/JP2018/047801 dated Mar. 2019. (Concise Explanation of Relevance: This Written Opinion considers that the claims are described by or obvious over the references cited.).

* cited by examiner

| ABNORMALITY TYPE | CHARGE/DISCHARGE STATE | BEHAVIOR OF INTERNAL RESISTANCE |
|---|---|---|
| POLARITY INVERSION | DURING DISCHARGE | INTERNAL RESISTANCE INCREASES AND THEN DECREASES |
| SHORT CIRCUIT | DURING CHARGE | INTERNAL RESISTANCE INCREASES (NO DECREASE) |
| | DURING DISCHARGE | INTERNAL RESISTANCE INCREASES (NO DECREASE) |

FIG. 7

CHARGEABLE BATTERY ABNORMALITY DETECTION APPARATUS AND CHARGEABLE BATTERY ABNORMALITY DETECTION METHOD

TECHNICAL FIELD

This disclosure relates to a chargeable battery abnormality detection apparatus and a chargeable battery abnormality detection method.

BACKGROUND ART

As technologies for detecting abnormalities of a chargeable battery, for example, there are technologies disclosed in Patent Document 1 and Patent Document 2.

Patent Document 1 discloses a technology related to a chargeable system. In the technology, a polarity inversion of a single battery in a series lithium secondary battery module is predicted and detected in advance and is identified with an alarm lamp, and a remaining battery is used to enable continued use as a module.

Patent Document 2 discloses a technology of detecting an internal short circuit of a battery. The internal short circuit is detected by discharging a complete battery such that constant current is caused to flow in two steps, i.e., a first discharge current Ia and a second discharge current Ib (Ib<Ia), and using a difference between the discharge currents to calculate a change in voltage at the time, i.e., a difference between a first discharge voltage and a second discharge voltage, as an internal resistance component.

CITATION LIST

Patent Documents

Patent Document 1: JP H06-89743 A
Patent Document 2: JP 2002-313435 A

SUMMARY

Technical Problem

Incidentally, in the technology disclosed in Patent Document 1, a voltage of each single battery (cell) constituting the battery module needs to be measured. In general, however, a battery module is sealed, and thus there is a problem in that measuring a voltage of each single battery is difficult, hindering detection of a polarity inversion.

Further, in the technology disclosed in Patent Document 2, controlling a load current is difficult in a case where a battery module is mounted on a vehicle, causing a limit on timings of detecting internal short circuits. Thus, there is a problem in that a delay may be caused from occurrence to detection of a short circuit.

The present disclosure is made in view of the circumstances as described above, and an object thereof is to provide a chargeable battery abnormality detection apparatus and a chargeable battery abnormality detection method capable of performing an abnormality of a chargeable battery at any timing.

Solution to Problem

To solve the problems described above, in one aspect, the present disclosure provides a chargeable battery abnormality detection apparatus configured to detect an abnormality of a chargeable battery, the chargeable battery abnormality detection apparatus including: a processor; and a memory storing instructions executable by the processor, wherein the processor performs the following when executing instructions: calculating a value of an internal resistance of the chargeable battery; determining whether the chargeable battery is being charged or being discharged; determining that an abnormality has occurred in the chargeable battery if either one of the following occurs: the calculated value of the internal resistance decreases while the chargeable battery is being discharged; and the calculated value of the internal resistance increases while the chargeable battery is being charged; and outputting a determination result of the abnormality.

According to such a configuration, an abnormality of the chargeable battery can be determined reliably at any timing.

Further, in the above-described chargeable battery abnormality detection apparatus, the processor may determine that the chargeable battery has been short-circuited when the calculated value of the internal resistance increases while the chargeable battery is being charged.

According to such a configuration, a short circuit can be easily detected at any timing.

Further, in the above-described chargeable battery abnormality detection apparatus, the processor may also determine that that the abnormality has occurred in the chargeable battery when the calculated value of the internal resistance increases greater than a value in a normal state of the chargeable battery while the chargeable battery is being discharged.

According to such a configuration, an abnormality can be reliably detected at any timing through comparison with the normal value.

Further, in the above-described chargeable battery abnormality detection apparatus, the processor may determine that a polarity inversion has occurred in the chargeable battery when the calculated value of the internal resistance increases greater than a value in a normal state of the chargeable battery, and subsequently the calculated value of the internal resistance starts decreasing while the chargeable battery is being discharged, and the processor may determine that a short circuit has occurred when the calculated value of the internal resistance increases greater than a value in a normal state of the chargeable battery, and subsequently the calculated value of the internal resistance does not start decreasing while the chargeable battery is being discharged.

According to such a configuration, a polarity inversion and a short circuit can be easily and reliably detected at any timing.

Further, in the above-described chargeable battery abnormality detection apparatus, the processor may determine that the calculated value of the internal resistance increases greater than the value in the normal state of the chargeable battery if a ratio or a difference between the value of the internal resistance at a present time and the internal resistance at a past predetermined time when the chargeable battery was in the normal state exceeds a predetermined threshold value.

According to such a configuration, an abnormality can be easily and reliably detected through comparison between values of the internal resistance.

Further, in the above-described chargeable battery abnormality detection apparatus, the processor may determine that the calculated value of the internal resistance increases greater than the value in the normal state of the chargeable battery if a value $\Delta R/\Delta SOC$ obtained by dividing $\Delta R$ by $\Delta SOC$ is less than a prescribed negative, where $\Delta R$ represents an amount of increase in the calculated internal resistance R per a predetermined time period, and ΔSOC is a negative value representing an amount of change in a state of charge SOC per a predetermined time period.

According to such a configuration, an abnormality can be easily detected on the basis of a relationship between the internal resistance and the state of charge.

Further, in the above-described chargeable battery abnormality detection apparatus, the processor calculates the value of the internal resistance by dividing a fluctuating value of a voltage in a predetermined time period by a fluctuating value of a current in the predetermined time period.

According to such a configuration, the internal resistance can be easily calculated.

Further, in the above-described chargeable battery abnormality detection apparatus, the chargeable battery abnormality detection apparatus may further include a voltage detector that detects a voltage of the chargeable battery, and the processor may further determine that the abnormality has occurred in the chargeable battery when the voltage detector detects a voltage drop corresponding to a voltage of one cell among a plurality of cells constituting the chargeable battery.

According to such a configuration, presence or absence of an abnormality can be more accurately detected by also referring to a detected voltage of the battery.

Further, in the above-described chargeable battery abnormality detection apparatus, after determining that the abnormality has occurred, the processor may determine that the abnormality has been resolved if a value obtained by dividing a value of the internal resistance at a certain time point at or after a point in time when the processor determined that the abnormality has occurred in the chargeable battery by a maximum value of the internal resistance at or after the point in time when the processor determined that the abnormality has occurred falls below a predetermined threshold value.

According to such a configuration, not only occurrence of an abnormality but also a resolution thereof can be detected.

Further, in the above-described chargeable battery abnormality detection apparatus, after determining that the polarity inversion has occurred, the processor may determine that the abnormality of the polarity inversion has been resolved if the calculated value of the internal resistance increases again after the processor has determined that the polarity inversion has occurred and then decreases.

According to such a configuration, not only occurrence of a polarity inversion but also a resolution of the polarity inversion can be decided.

Further, in the above-described chargeable battery abnormality detection apparatus, after determining that the abnormality has occurred, the processor may determine that the abnormality has been resolved if a voltage of the chargeable battery increases to reach or exceed a predetermined threshold value after the processor has determined that the abnormality has occurred in the chargeable battery.

According to such a configuration, not only occurrence of an abnormality but also a resolution thereof can be detected.

In another aspect, the present disclosure provides a chargeable battery abnormality detection method of detecting an abnormality of a chargeable battery, the chargeable battery abnormality detection method including: calculating a value of an internal resistance of the chargeable battery; determining whether the chargeable battery is being charged or being discharged; determining that an abnormality has occurred in the chargeable battery if either one of the following occurs: the calculated value of the internal resistance decreases while the chargeable battery is being discharged; and the calculated value of the internal resistance increases while the chargeable battery is being charged; and outputting a determination result of the abnormality.

According to such a method, an abnormality of the chargeable battery can be detected reliably at any timing.

Advantageous Effects of Invention

According to the present disclosure, a chargeable battery abnormality detection apparatus and a chargeable battery abnormality detection method capable of detecting an abnormality of a chargeable battery at any timing can be provided.

BRIEF DESCRIPTION OF DRAWINGS

FIG. 7 is a table showing a relationship between a type of abnormality, a charge state, and behavior of in an internal resistance.

DESCRIPTION OF EMBODIMENTS

Next, embodiments of the present invention will be described.

(A) Description of Configuration According to Embodiment of Present Invention

Figure 1:
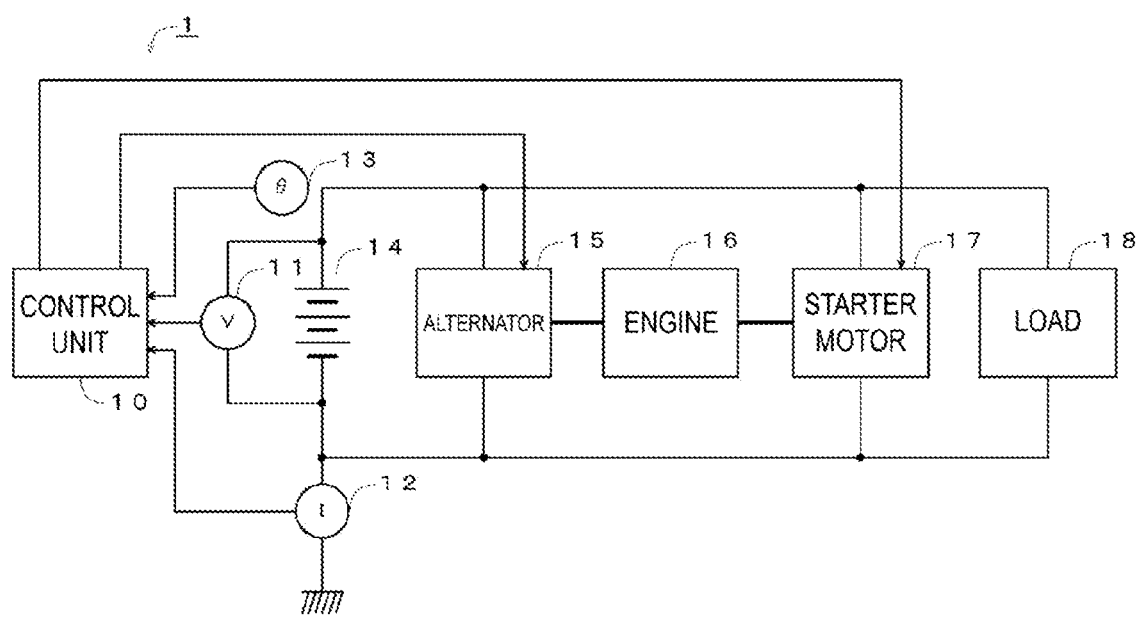
FIG. 1 is a diagram illustrating a configuration example of a chargeable battery abnormality detection apparatus according to an embodiment of the disclosure.

FIG. 1 is a diagram illustrating a power supply system of a vehicle including a chargeable battery abnormality detection apparatus according to an embodiment of the disclosure. In FIG. 1, a chargeable battery abnormality detection apparatus 1 includes a control unit 10, a voltage sensor 11, a current sensor 12, and a temperature sensor 13 as main components, and is configured to detect occurrence of an abnormality inside a chargeable battery 14. Note that the temperature sensor 13 may be omitted from the configuration.

Here, the control unit 10 detects a state of the chargeable battery 14 by referring to outputs from the voltage sensor 11, the current sensor 12, and the temperature sensor 13, and controls a charge state of the chargeable battery 14 by controlling a generated voltage of an alternator 15. Note that the voltage sensor 11, the current sensor 12, and the temperature sensor 13 may be incorporated into the control unit 10, or may be provided outside the control unit 10. The voltage sensor 11 detects a terminal voltage of the chargeable battery 14, and reports the detected results to the control unit 10. The current sensor 12 detects a current flowing in the chargeable battery 14, and reports the detected results to the control unit 10. The temperature sensor 13 detects a temperature of an electrolytic solution of the chargeable battery 14 or an ambient temperature, and reports the detected results to the control unit 10. Note that, instead of the control unit 10 controlling the charge state of the chargeable battery 14 by controlling the generated voltage of the alternator 15, for example, an Electric Control Unit (ECU) (not illustrated) may control the charge state.

The chargeable battery 14 is a chargeable battery including an electrolytic solution, such as a lead-acid battery, a nickel-cadmium battery, or a nickel-metal hydride battery. The chargeable battery 14 is charged by the alternator 15, drives a starter motor 17 to start an engine, and supplies electric power to a load 18. Note that the chargeable battery 14 includes a plurality of cells connected in series. The alternator 15 is driven by an engine 16, generates AC power and converts the generated AC power into DC power through a rectifier circuit, and charges the chargeable battery 14. The alternator 15 is controlled by the control unit 10 so that the generated voltage can be adjusted.

For example, the engine 16 is configured by a reciprocating engine such as a petrol engine or a diesel engine, a rotary engine, or the like. The engine 16 is started by the starter motor 17 and drives drive wheels via a transmission to supply propulsive power to the vehicle and also drives the alternator 15 to generate electric power. For example, the starter motor 17 is configured by a DC motor and generates a rotational force by using electric power supplied from the chargeable battery 14 to start the engine 16. For example, the load 18 is configured by an electric power steering motor, a defogger, a seat heater, an ignition coil, a car audio system, a car navigation system, or the like. The load 18 operates by electric power supplied from the chargeable battery 14.

Figure 2:
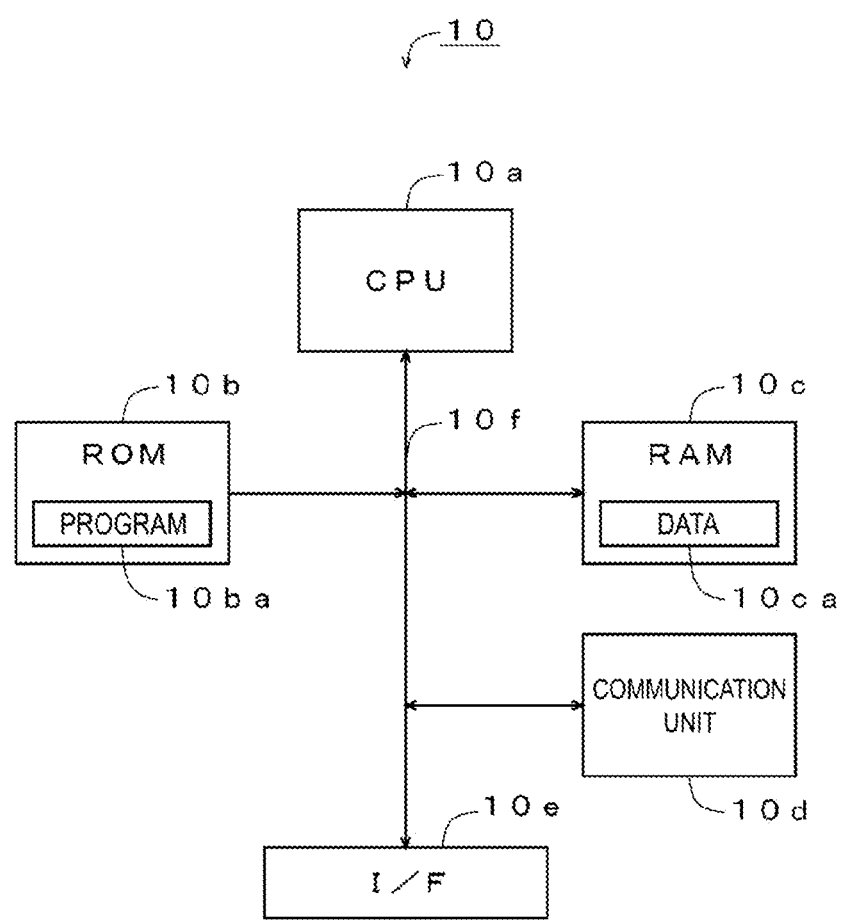
FIG. 2 is a block diagram illustrating a detailed configuration example of a control unit of FIG. 1.

FIG. 2 is a diagram illustrating a detailed configuration example of the control unit 10 illustrated in FIG. 1. As illustrated in FIG. 2, the control unit 10 includes a Central Processing Unit (CPU) 10*a*, a Read Only Memory (ROM) 10*b*, a Random Access Memory (RAM) 10*c*, a communication unit 10*d*, an Interface (I/F) 10*e*, and a bus 10*f*. Here, the CPU 10*a* controls components on the basis of a program 10*ba* stored in the ROM 10*b*. The ROM 10*b* is configured by a semiconductor memory or the like, and stores, for example, the program 10*ba* including a group of commands that can be executed by the CPU 10*a*. The RAM 10*c* is configured by a semiconductor memory or the like, and stores data generated at the time of execution of the program 10*ba* and data 10*ca* (described later) such as a table. The communication unit 10*d* communicates with an Electronic Control Unit (ECU) serving as a higher-level device, for example, and reports detected information or control information to the higher-level device. The I/F 10*e* receive signals supplied from the voltage sensor 11, the current sensor 12, and the temperature sensor 13 by converting the signals into digital signals, and supplies a driving current to the alternator 15, the starter motor 17, or the like such that those components are controlled. The bus 10*f* is a group of signal lines for connecting the CPU 10*a*, the ROM 10*b*, the RAM 10*c*, the communication unit 10*d*, and the I/F 10*e* to each other, and for enabling those components to exchange information with each other. Note that a Digital Signal Processor (DSP), a Field Programmable Gate Array (FPGA), or an Application Specified Integrated Circuit (ASIC) may be used instead of the CPU 10*a*.

(B) Description of Operation According to Embodiment of Present Invention

Next, operation according to embodiments of the disclosure will be described. Note that an operation mechanism according to the embodiments of the disclosure will be first described below, and then detailed operation will be described.

Figure 3A:
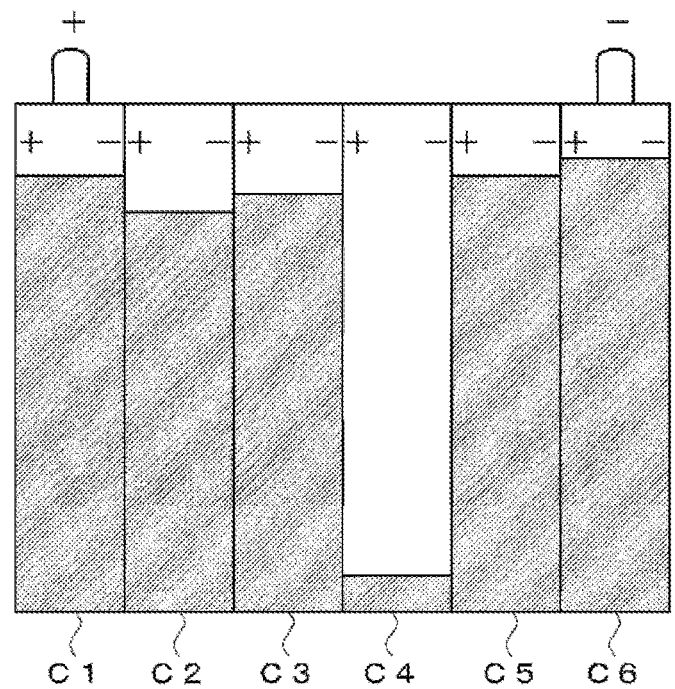
FIG. 3A includes diagrams for illustrating a polarity inversion.
Figure 3B:
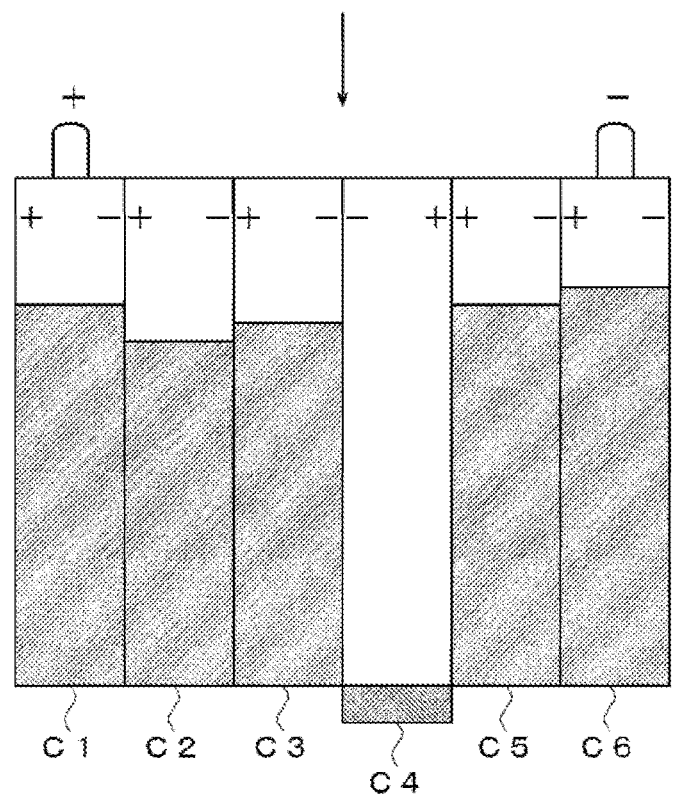
FIG. 3B includes diagrams for illustrating a polarity inversion.

First, the operation mechanism according to the embodiments of the disclosure will be described. In the embodiments of the disclosure, a "polarity inversion" and a "short circuit", each of which is an abnormality of the chargeable battery 14, are detected on the basis of a change in an internal resistance of the chargeable battery 14. FIG. 3A and FIG. 3B includes diagrams schematically illustrating the mechanism of occurrence of the former case, i.e., a polarity inversion. The diagrams in FIG. 3A and FIG. 3B schematically illustrate a lead-acid battery composed of six cells C1 to C6. FIG. 3A illustrates a state immediately before occurrence of a polarity inversion, and FIG. 3B illustrates a state immediately after the occurrence of the polarity inversion. Note that hatching illustrated in the cells C1 to C6 represents a state of charge of each of the cells C1 to C6. Further, the protrusions at the top of the lead-acid battery represent positive (+) and negative (−) connection terminals. Further, the plus and minus signs illustrated in the cells C1 to C6 represent polarity of each of the cells C1 to C6.

In FIG. 3A, only the cell C4 has a low state of charge, and the other cells have a high state of charge. In such a state, if power is continuously supplied to a load, the state of charge of the cell C4 reaches nearly 0%. If the battery is continuously discharged furthermore, the cell C4 is charged in a reverse direction due to a current flowing from adjacent cells. As a result, as illustrated in FIG. 3B, polarity of the cell C4 is reversed, and the state of charge turns negative as indicated by hatching in the reverse direction.

Specifically, the polarity inversion refers to a phenomenon in which the polarity of a voltage output by at least one cell out of a plurality of cells constituting the chargeable battery 14 is inversed. More specifically, regarding a battery pack including a plurality of cells, as illustrated in FIG. 3A and FIG. 3B, individual cells may have different states of charge. In such a case, a voltage of some cell may reach a final voltage (a voltage that may cause an adverse effect on a cell if the cell is further discharged even after reaching the voltage), although the battery pack as a whole has remaining capacity. If such a cell is used continuously, the cell is charged in a reverse direction due to a current flowing from other cells. This may cause polarity inversion, where the positive pole and the negative pole are inversed. Such a cell being subject to polarity inversion generates heat when the cell is charged and discharged. The heat deteriorates neighboring cells, causing further deterioration as a whole.

Figure 4:
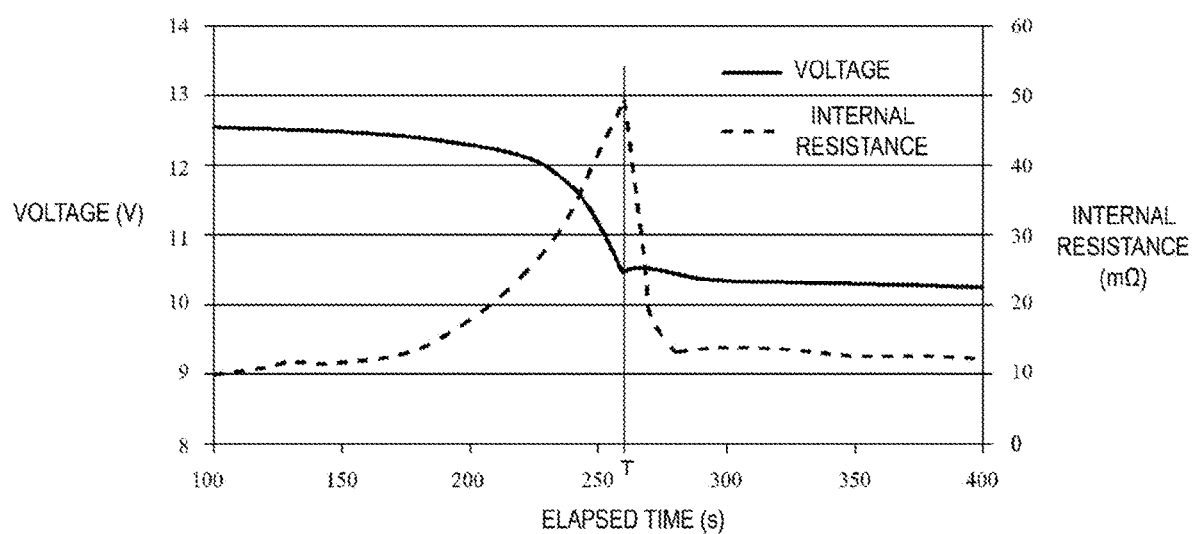
FIG. 4 is a graph showing temporal changes in a voltage and an internal resistance when a polarity inversion occurs.

FIG. 4 is a graph showing temporal changes in a voltage and an internal resistance when a polarity inversion occurs in the chargeable battery 14. More specifically, FIG. 4 is a graph showing temporal changes in a voltage and an internal resistance when a polarity inversion occurs in a lead-acid battery composed of six cells while a current is supplied to a load. In FIG. 4, the horizontal axis represents elapsed time (second (s)) from the start of measurement, and the vertical axis represents a voltage (V) and an internal resistance (mΩ) of the chargeable battery. In a case where a polarity inversion occurs, the state of charge approaches nearly 0 in a predetermined cell, and thus the voltage decreases. Further, the decrease in the voltage increases inactive materials (lead sulfate) of electrode plates, and thus the internal resistance increases.

When a polarity inversion occurs at elapsed time T (s) shown in FIG. 4, the cell is charged in a reverse direction. Thus, the increasing inactive materials start decreasing, and the internal resistance decreases. The voltage, by contrast, comes to approximately 10 V, because a voltage corresponding to one cell (approximately 2 V) is canceled out.

Specifically, in a case where a polarity inversion occurs in the chargeable battery, the increasing internal resistance starts decreasing, and the voltage decreases by an amount of a corresponding cell (one cell in FIG. 4).

In the present embodiment, occurrence of a polarity inversion of the chargeable battery 14 is detected on the basis of characteristic changes in a voltage and an internal resistance as described above.

Figure 5:
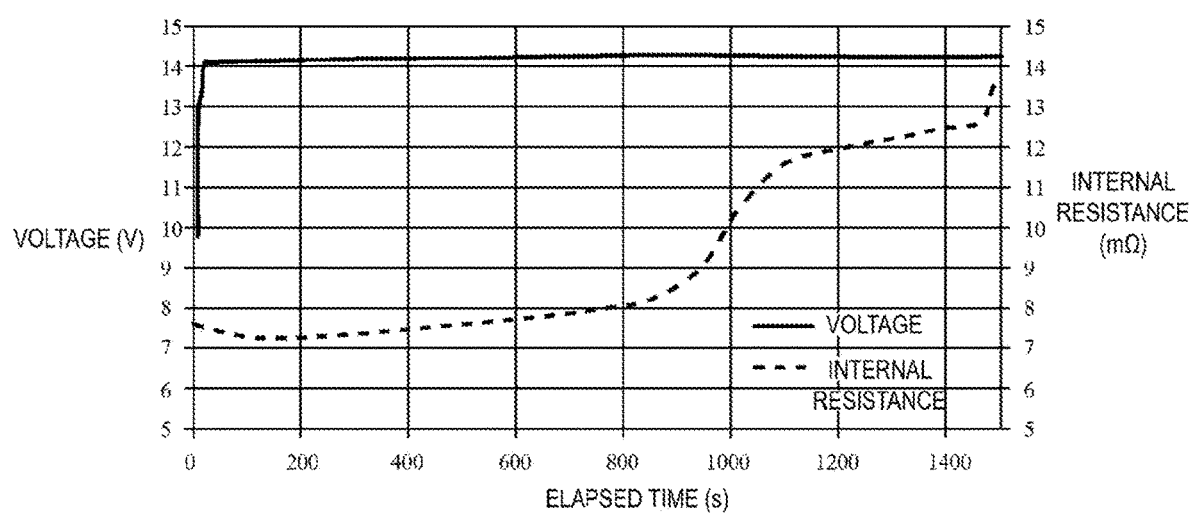
FIG. 5 is a graph showing temporal changes in a voltage and an internal resistance when a short circuit occurs during charge.

In contrast, FIG. 5 shows changes in a voltage and an internal resistance in a case where a short circuit occurs in the chargeable battery 14 during charge. More specifically, FIG. 5 is a graph showing temporal changes in a voltage and an internal resistance when a short circuit occurs while a lead-acid battery composed of six cells is charged. In FIG. 5, the horizontal axis represents elapsed time (second (s)) from the start of measurement, and the vertical axis represents a voltage (V) and an internal resistance (mΩ) of the chargeable battery. For example, suppose that lead sulfate being inactive materials falls off electrode plates and crosslinks the positive and negative electrode plates in a predetermined cell. If the battery is charged in such a case, inactive materials having high electrical resistance turn into lead having low electrical resistance due to the charge. As a result, the positive and negative electrode plates are short-circuited.

In the example of FIG. 5, the battery is being charged by means of constant voltage charge, and thus the voltage is constant at approximately 14 V. The internal resistance, by contrast, increases as the short circuit progresses. In comparison with FIG. 4, the increasing internal resistance does not start decreasing in the case of a short circuit. Note that the example of FIG. 5 shows a case of constant voltage charge. In a case of constant current charge, however, it is assumed that the voltage decreases.

Figure 6:
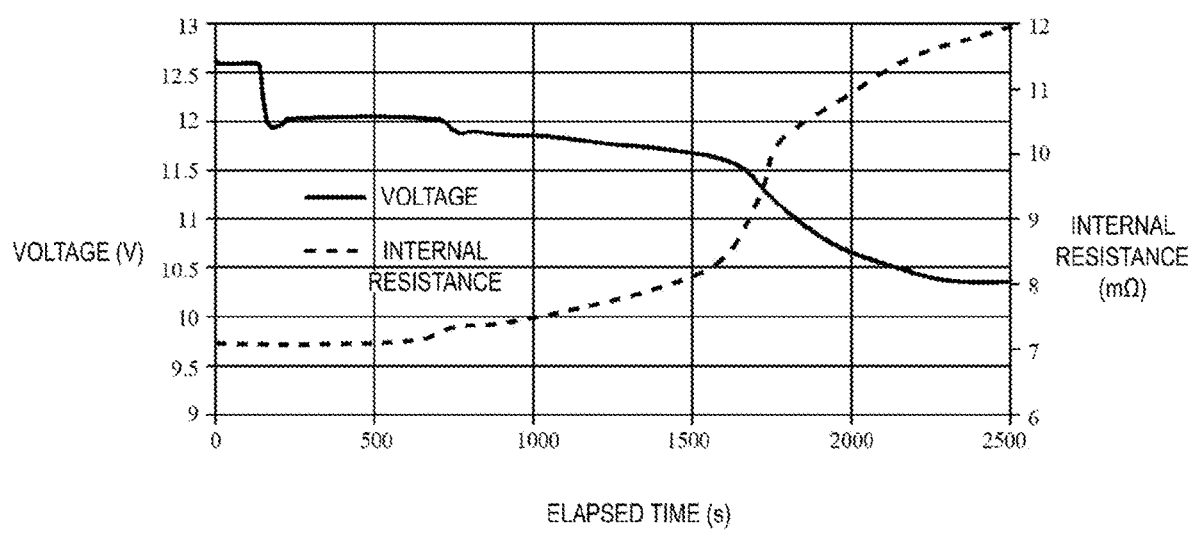
FIG. 6 is a graph showing temporal changes in a voltage and an internal resistance when a short circuit occurs during discharge.

FIG. 6 shows changes in a voltage and an internal resistance in a case where a short circuit occurs in the chargeable battery 14 during discharge. More specifically, FIG. 6 is a graph showing temporal changes in a voltage and an internal resistance when a short circuit occurs while a lead-acid battery composed of six cells, similar to that of FIG. 5, is discharged. In FIG. 6, the horizontal axis represents elapsed time (second (s)) from the start of measurement, and the vertical axis represents a voltage (V) and an internal resistance (mΩ) of the chargeable battery. For example, in a predetermined cell, for example, if lead or lead dioxide constituting the electrode plates falls off the electrode plates due to an impact or the like and crosslinks the positive and negative electrode plates, the positive and negative electrode plates are short-circuited.

In the example of FIG. 6, the battery is being discharged, and thus the voltage shows a tendency to decrease. Further, the voltage decreases by a voltage corresponding to one cell as the short circuit progresses, and thus the voltage decreases by approximately 2 V. Further, the internal resistance increases as the short circuit progresses. Note that, unlike the case of FIG. 4, the increasing internal resistance does not start decreasing in the case of a short circuit as is the case with FIG. 5.

FIG. 7 is a table showing a relationship between a type of abnormality, a charge/discharge state, and behavior of an internal resistance of the chargeable battery 14. As shown in FIG. 7, a polarity inversion occurs during discharge, and behavior that the internal resistance increases and then decreases is exhibited. Further, a short circuit occurs during both charge and discharge, and the behavior that the internal resistance increases and then decreases is not exhibited. Note that the internal resistance increases during discharge also in a case where the chargeable battery 14 is in a normal state; however, in a case where a short circuit or a polarity inversion occurs, the internal resistance increases in a greater degree than in a normal state.

In the present embodiment, an abnormality of the chargeable battery 14 is detected on the basis of the behavior of the chargeable battery 14 as described above.

More specifically, the chargeable battery abnormality detection apparatus 1 measures a state of charge and an internal resistance of the chargeable battery 14 in a normal state, and sets those measured results as a reference state of charge SOC0 and reference internal resistance R0, respectively. Note that, for example, the normal state refers to a state at a time point when the chargeable battery 14 is mounted on a vehicle or a time point after the elapse of a certain time period (for example, several hours or several days) from such mounting. As a matter of course, in a case where an abnormality such as a short circuit or a polarity inversion does not occur at time points, the time points other than those described above may be adopted.

Figure 8A:
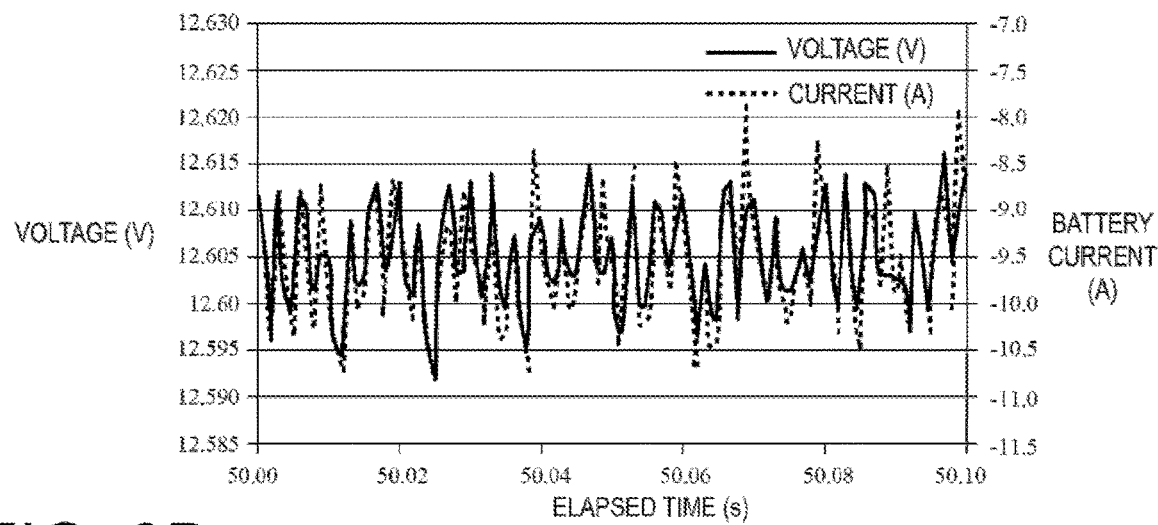
FIG. 8A is a graph showing a method of measuring an internal resistance.
Figure 8B:
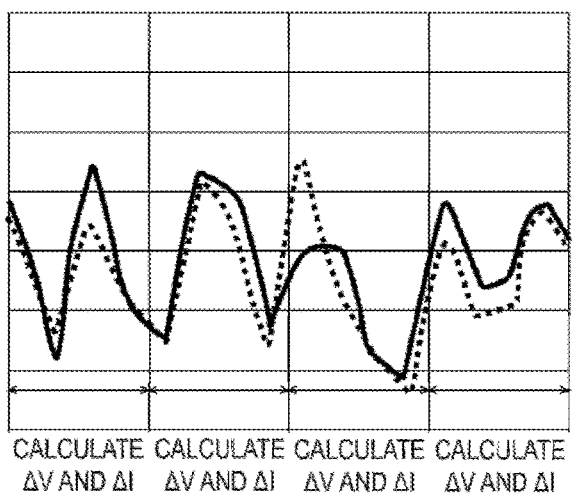
FIG. 8B is a graph showing a method of measuring an internal resistance.

Next, the chargeable battery abnormality detection apparatus 1 calculates an internal resistance at the present time point. FIG. 8A is a graph showing changes in a voltage and a current of the chargeable battery 14. Note that, in FIG. 8A, the horizontal axis represents elapsed time (s) from the start of measurement, and the vertical axis represents a voltage (V) and a current (A). FIG. 8B is a partially enlarged graph of FIG. 8A. In the present embodiment, for example, the amount of change in voltage $\Delta V$ and the amount of change in current $\Delta I$ are measured per microsecond. Then, for example, $\Delta Va$ and $\Delta Ia$ are calculated through cumulative addition performed for 10 seconds. Using the calculated values, a value of internal resistance R ($=\Delta Va/\Delta Ia$) is calculated by $\Delta Va/\Delta Ia$.

Next, the chargeable battery abnormality detection apparatus 1 calculates a state of charge SOC at the present time point. More specifically, the chargeable battery abnormality detection apparatus 1 measures a voltage of the chargeable battery 14 in a stable state in which polarization, stratification, or the like of the chargeable battery 14 is resolved after the elapse of a predetermined time period (for example, several hours) from the stop of the engine 16, and sets the measured voltage as an open circuit voltage OCV. The open circuit voltage OCV and the state of charge SOC have a certain relationship. Thus, for example, the state of charge SOC in a stable state can be calculated by referring to information stored in a table that shows the relationship between the open circuit voltage OCV and the state of charge SOC. After the engine 16 is started, the state of charge SOC at the present time point can be calculated by cumulatively adding a current input and output to and from the chargeable battery 14, and adding the obtained value to SOC in a stable state calculated as described above.

Next, the chargeable battery abnormality detection apparatus 1 compares the state of charge SOC at the present time point and the reference state of charge SOC0, and can thereby determine whether the chargeable battery 14 is being charged or being discharged.

In a case where the chargeable battery abnormality detection apparatus 1 determines that the chargeable battery 14 is being charged, the chargeable battery abnormality detection apparatus 1 determines whether or not the internal resistance R is increasing. More specifically, the chargeable battery abnormality detection apparatus 1 calculates a ratio (R/R0) between the value of the internal resistance R at the present time point and the reference internal resistance R0. In a case where the ratio is greater than a predetermined threshold value Th1 (Th1>1) (in a case where R/R0>Th1), the chargeable battery abnormality detection apparatus 1 determines that the internal resistance is increasing. Incidentally, in general, the internal resistance decreases during charge. Thus, in a case where the internal resistance increases during charge, it can be determined that there is an abnormality. Further, in such a case, as shown in FIG. 7, it can be determined that a short circuit occurs.

In contrast, in a case where the chargeable battery abnormality detection apparatus 1 determines that the chargeable battery 14 is being discharged, the chargeable battery abnormality detection apparatus 1 determines whether or not the internal resistance R is increasing. More specifically, the chargeable battery abnormality detection apparatus 1 calculates a ratio (R/R0) between the value of the internal resistance R at the present time point and the reference internal resistance R0. In a case where the ratio is greater than a predetermined threshold value Th2 (Th2>1) (in a case where R/R0>Th2), the chargeable battery abnormality detection apparatus 1 determines that the internal resistance is increasing. Incidentally, in general, the internal resistance increases during discharge. Thus, in a case where the internal resistance increases during discharge, it cannot be immediately determined that there is an abnormality. Accordingly, as the threshold value Th2, a predetermined value that is greater than the increase in the internal resistance in a regular state is set, and it is determined that there may be an occurrence of an abnormality in a case where R/R0>Th2. Then, the value of the internal resistance R is calculated for a predetermined time period. In a case where the internal resistance increases and then starts decreasing, it can be determined that there is a polarity inversion shown in FIG. 7. Further, in a case where the internal resistance increases but does not start decreasing, it can be determined that there is a short circuit.

Note that, in a case where occurrence of an abnormality is detected, the chargeable battery abnormality detection apparatus 1 can report the occurrence of the abnormality to the higher-level device (for example, an ECU), and can report either a polarity inversion or a short circuit as the details of the abnormality.

As described above, according to the embodiment of the disclosure, a situation in which behavior of the internal resistance of the chargeable battery 14 is different from regular behavior (for example, behavior that internal resistance gently decreases during charge, and gently increases during discharge) is detected, and this allows a polarity inversion and a short circuit of the chargeable battery 14 to be detected.

Further, in the present embodiment, an internal resistance of the whole chargeable battery 14 including a plurality of cells is calculated, and an abnormality is determined on the basis of the internal resistance. This eliminates measurement of individual cells, which is the case with Patent Document 1, for example. Thus, various types of abnormalities of the chargeable battery 14 can be easily detected. Further, in the present embodiment, abnormalities can be detected while the chargeable battery 14 is charged or discharged. Thus, timing of abnormality detection is not limited to specific timing, which is the case with Patent Document 2, for example. Instead, abnormalities can be detected at any timing.

Next, with reference to FIGS. 9 to 12, the details of processing performed in the embodiment illustrated in FIG. 1 will be described.

Figure 9:
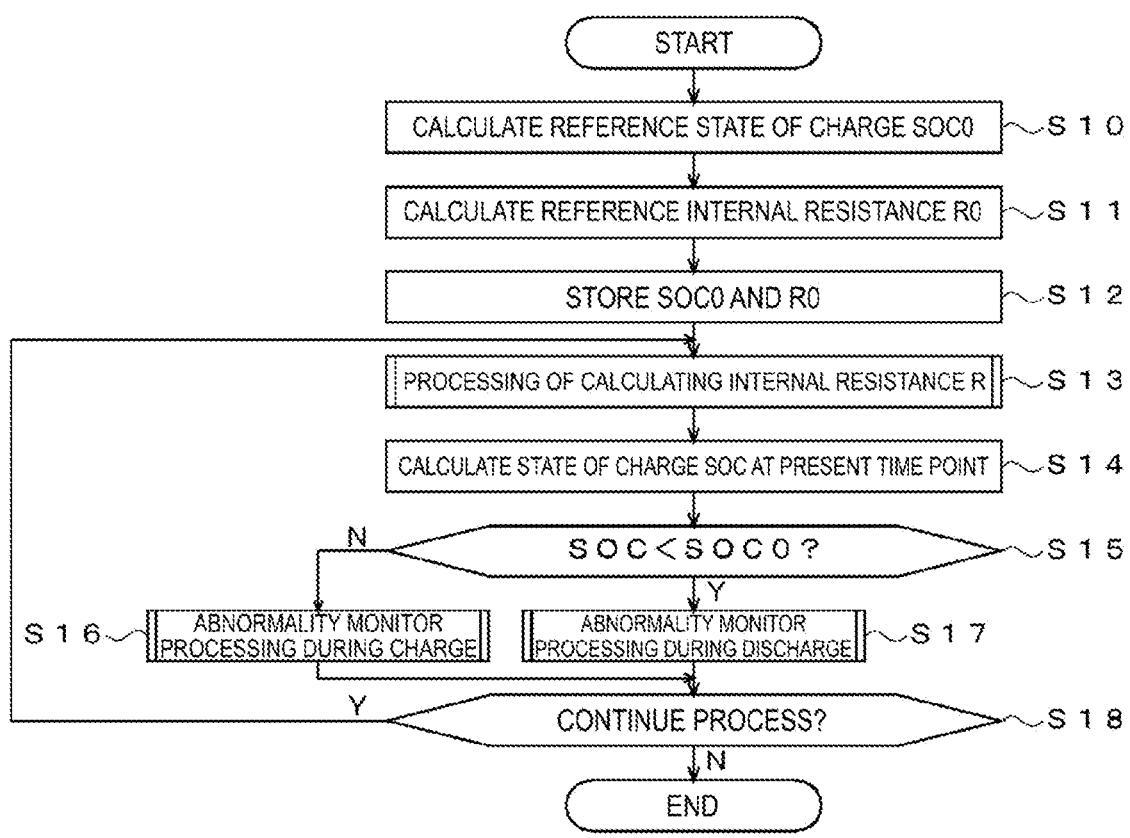
FIG. 9 is a flowchart illustrating an example of processing performed in the embodiment illustrated in FIG. 1.

FIG. 9 is a flowchart illustrating details of processing performed in the control unit 10 illustrated in FIG. 1. When the processing of the flowchart illustrated in FIG. 9 is started, the following steps are performed.

In Step S10, the CPU 10*a* of the control unit 10 calculates a reference state of charge SOC0. More specifically, the CPU 10*a* measures a voltage of the chargeable battery 14 in a stable state in which polarization, stratification, or the like of the chargeable battery 14 is resolved with the use of the voltage sensor 11, and sets the measured voltage as an open circuit voltage OCV. Then, the CPU 10*a* can calculate a state of charge SOC in a stable state by using information (or a mathematical expression showing a relationship between the open circuit voltage OCV and the state of charge SOC) stored in a table (for example, a table stored in the data 10*ca* of the RAM 10*c*) storing information showing a relationship between the open circuit voltage OCV and the state of charge SOC. The CPU 10*a* can calculate a state of charge SOC at the present time point by measuring a current input and output to and from the chargeable battery 14 with the use of the current sensor 12 and cumulatively adding the measured results, and adding the value calculated as described above to SOC. According to the above method, the state of charge SOC can be calculated at predetermined timing (for example, timing when the engine 16 is started), and the calculated result can be set as the reference state of charge SOC0. Note that the open circuit voltage OCV fluctuates depending on a temperature of an electrolytic solution of the chargeable battery 14. For this reason, the open circuit voltage OCV may be corrected on the basis of an estimated temperature, which is obtained by measuring an ambient temperature of the chargeable battery 14 with the use of the temperature sensor 13, and then estimating the temperature of the electrolytic solution on the basis of the measured ambient temperature.

In Step S11, the CPU 10*a* calculates a reference internal resistance R0. More specifically, as has been described with reference to FIG. 8A and FIG. 8B, at predetermined timing (for example, timing when the engine 16 is started), for example, the CPU 10*a* measures the amount of change in voltage $\Delta V$ and the amount of change in current $\Delta I$ per microsecond. Then, for example, the CPU 10*a* calculates $\Delta Va$ and $\Delta Ia$ through cumulative addition performed for 10 seconds. Using the calculated values, the CPU 10*a* calculates a value of internal resistance R (=$\Delta Va/\Delta Ia$) by $\Delta Va/\Delta Ia$. Note that 1 microsecond and 10 seconds are merely examples, and time may be set to time other that those described above.

In Step S12, the CPU 10a stores the reference state of charge SOC0 calculated in Step S10 and the reference internal resistance R0 calculated in Step S11 in the RAM 10c, for example.

In Step S13, the CPU 10a performs processing of calculating the internal resistance R at the present time point. Note that the details of the processing of Step S13 will be described later with reference to FIG. 10.

In Step S14, the CPU 10a calculates a state of charge SOC at the present time point. More specifically, the state of charge SOC at the present time point can be calculated by calculating a state of charge SOC in a stable state on the basis of OCV in a stable state, measuring a current input and output to and from the chargeable battery 14 with the use of the current sensor 12 and cumulatively adding the measured results, and adding the obtained value to SOC in a stable state described above.

In Step S15, the CPU 10a compares the state of charge SOC at the present time point calculated in Step S14 and the reference state of charge SOC0 calculated in Step S10, and determines whether SOC<SOC0 is satisfied. In a case where SOC<SOC0 is satisfied (Y in Step S15), the process proceeds to Step S17. Otherwise (N in Step S15), the process proceeds to Step S16. More specifically, in a case where SOC<SOC0 is satisfied, it can be determined that the battery is being discharged. In such a case, the process proceeds to abnormality monitor processing during discharge of Step S17. In a case where SOC>SOC0 is satisfied, it can be determined that the battery is being charged (or the battery is in a state in which its SOC does not vary). In such a case, the process proceeds to abnormality monitor processing during charge of Step S16. Note that the details of the abnormality monitor processing during charge of Step S16 and the abnormality monitor processing during discharge of Step S17 will be described later with reference to FIG. 11 and FIG. 12, respectively.

In Step S18, the CPU 10a determines whether or not to continue the process. In a case where the CPU 10a determines to continue the process (Y in Step S18), the process returns to Step S13, and a process similar to that described above is repeated. Otherwise (N in Step S18), the process ends.

Figure 10:
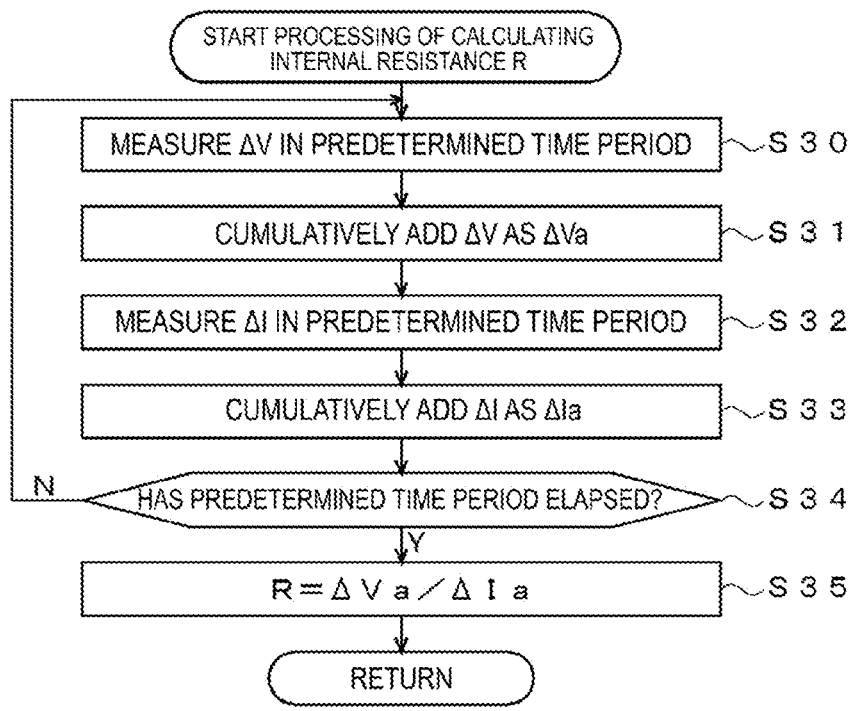
FIG. 10 is a flowchart illustrating an example of processing of calculating an internal resistance R illustrated in FIG. 9.

Next, with reference to FIG. 10, the details of "processing of calculating internal resistance R" illustrated in Step S13 of FIG. 9 will be described. When the processing of the flowchart illustrated in FIG. 10 is started, the following steps are performed.

In Step S30, the CPU 10a refers to output of the voltage sensor 11, and measures the amount of change in voltage $\Delta V$ in a predetermined time period (for example, in 10 ms).

In Step S31, the CPU 10a cumulatively adds the amount of change in voltage $\Delta V$ measured in Step S30, and sets the obtained result as $\Delta Va$. Specifically, the CPU 10a calculates $\Delta Va \leftarrow \Delta Va + \Delta V$.

In Step S32, the CPU 10a refers to output of the current sensor 12, and measures the amount of change in current $\Delta I$ in a predetermined time period (for example, in 10 ms).

In Step S33, the CPU 10a cumulatively adds the amount of change in current $\Delta I$ measured in Step S32, and sets the obtained result as Ma. Specifically, the CPU 10a calculates $\Delta Ia \leftarrow \Delta Ia + \Delta I$.

In Step S34, the CPU 10a determines whether a predetermined time period has elapsed. In a case where the CPU 10a determines that the predetermined time period (for example, 10 seconds) has elapsed (Y in Step S34), the process proceeds to Step S35. Otherwise (N in Step S34), the process returns to Step S30, and a process similar to that described above is repeated.

In Step S35, the CPU 10a calculates a value of the internal resistance R according to $R = \Delta Va / \Delta Ia$. Then, the process returns to the original processing.

According to the processing described above, the internal resistance R at the present time point can be calculated.

Figure 11:
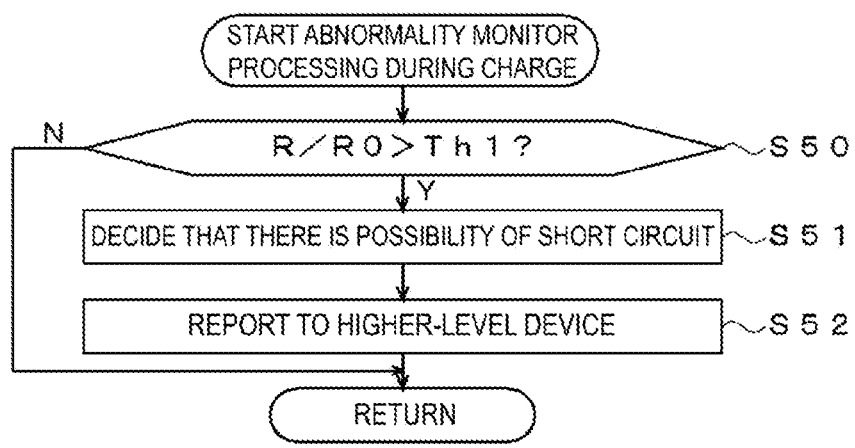
FIG. 11 is a flowchart illustrating an example of abnormality monitor processing during charge illustrated in FIG. 9.

Next, with reference to FIG. 11, the details of "abnormality monitor processing during charge" illustrated in Step S16 of FIG. 9 will be described. When the processing of the flowchart illustrated in FIG. 11 is started, the following steps are performed.

In Step S50, the CPU 10a determines whether $R/R0 > Th1$ is satisfied, on the basis of the internal resistance R calculated in Step S13 and the reference internal resistance R0 calculated in Step S11. In a case where the CPU 10a determines that $R/R0 > Th1$ is satisfied (Y in Step S50), the process proceeds to Step S51. Otherwise (N in Step S50), the process returns to the original processing.

In Step S51, on the basis of FIG. 7, the CPU 10a determines that there is a possibility that a short circuit occurs in the electrode plates of the chargeable battery 14, because the internal resistance R increases while the chargeable battery 14 is charged.

In Step S52, the CPU 10a reports the possibility of a short circuit to the higher-level device (for example, an ECU) (not illustrated) via the communication unit 10d.

According to the processing described above, when the internal resistance increases while the chargeable battery 14 is charged, it can be determined that there is a possibility of a short circuit, and the possibility can be reported to the higher-level device.

Figure 12:
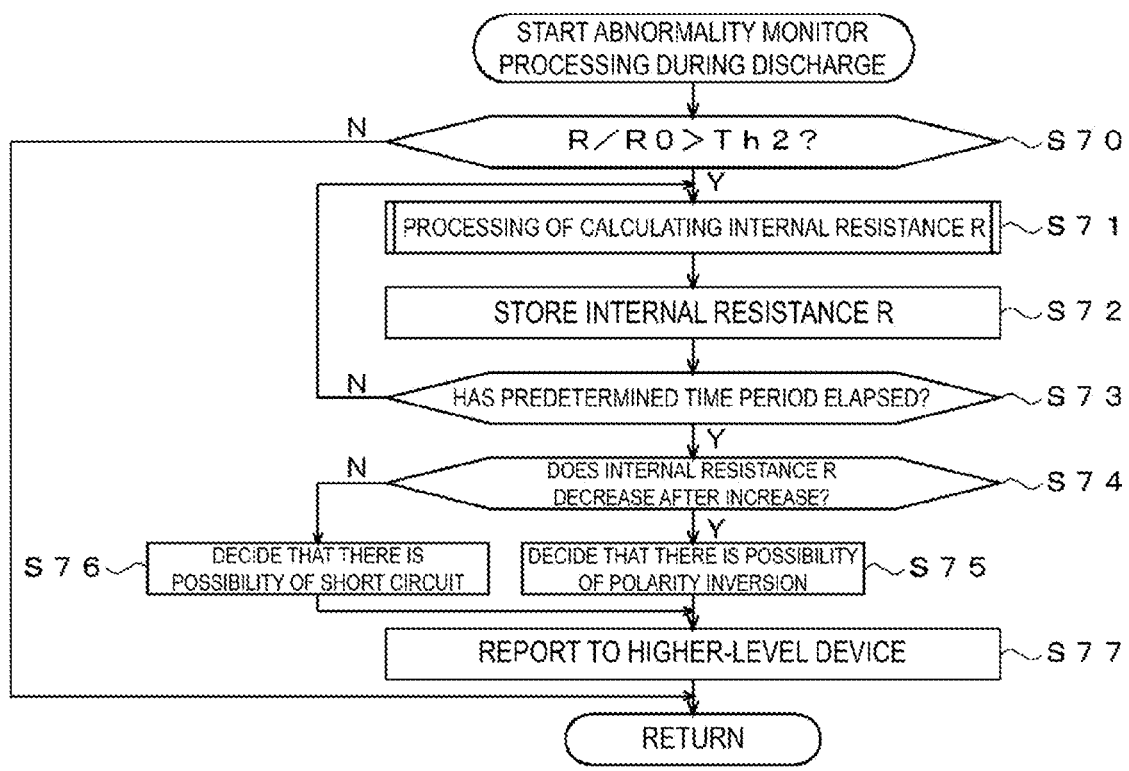
FIG. 12 is a flowchart illustrating an example of abnormality monitor processing during discharge illustrated in FIG. 9.

Next, with reference to FIG. 12, the details of "abnormality monitor processing during discharge" illustrated in Step S17 of FIG. 9 will be described. When the processing of the flowchart illustrated in FIG. 12 is started, the following steps are performed.

In Step S70, the CPU 10a determines whether $R/R0 > Th2$ is satisfied, on the basis of the internal resistance R calculated in Step S13 and the reference internal resistance R0 calculated in Step S11. In a case where the CPU 10a determines that $R/R0 > Th2$ is satisfied (Y in Step S70), the process proceeds to Step S71. Otherwise (N in Step S70), the process returns to the original processing. Note that, in comparison with the threshold value Th1 in Step S50, the threshold value Th2 in Step S70 can be set to satisfy $Th2 > Th1$. Specifically, in general, the internal resistance decreases while the chargeable battery 14 is charged. Thus, it can be decided that there is an abnormality in a case where the internal resistance increases even for a slight amount. In contrast, in general, the internal resistance increases during discharge. Thus, the threshold value Th2 needs to be set to a value greater than such an increase. Note that the threshold value Th2 may be set to change depending on the magnitude of a discharge current. Specifically, a large value can be adopted as the threshold value Th2 in a case where the discharge current is large, and a small value can be adopted as the threshold value Th2 in a case where the discharge current is small.

In Step S71, the CPU 10a performs processing of calculating the internal resistance R at the present time point. Note that the processing is similar to the processing described above with reference to FIG. 10.

In Step S72, the CPU 10a stores the internal resistance R calculated in Step S71 in the RAM 10c in time series, for example.

In Step S73, the CPU 10a determines whether a predetermined time period (for example, one hour) has elapsed. In a case where the CPU 10a determines that the predetermined time period has elapsed (Y in Step S73), the process proceeds to Step S74. Otherwise (N in Step S73), the process returns to Step S71, and a process similar to that described above is repeated. Note that a change in the internal resistance may be observed over time, and in a case where the internal resistance decreases after an increase, the process may proceed to Step S74 even before the predetermined time period elapses.

In Step S74, the CPU 10a refers to the plurality of values of the internal resistance R stored in the RAM 10c in time series in Step S72, and determines whether the internal resistance R decreases after increase. In a case where the CPU 10a determines that the internal resistance R decreases after increase (Y in Step S74), the process proceeds to Step S75. Otherwise (N in Step S74), the process proceeds to Step S76.

In Step S75, on the basis of FIG. 7, the CPU 10a decides that there is a possibility of a polarity inversion, because the value of the internal resistance R decreases after increase.

In Step S76, on the basis of FIG. 7, the CPU 10a decides that there is a possibility of a short circuit, because the value of the internal resistance R does not decrease after increase.

In Step S77, the CPU 10a reports the possibility of a polarity inversion or a short circuit to the higher-level device via the communication unit 10d. Then, the process returns to the original processing.

According to the processing described above, a possibility of a short circuit or a polarity inversion can be decided on the basis of behavior of an internal resistance while the chargeable battery 14 is discharged.

(C) Description of Modified Embodiments

It goes without saying that the above embodiment is merely an example, and the disclosure is not limited only to the case as described above. For example, in the above embodiment, the internal resistance R is calculated through the processing illustrated in FIG. 10. However, the value of the internal resistance R may be calculated with a method other than this method. For example, a voltage and a current when a current flows in a load are calculated, and on the basis of the voltage and the current, the internal resistance may be calculated. Alternatively, an equivalent circuit of the chargeable battery 14 is set, a voltage and a current of the chargeable battery 14 are measured, and on the basis of the voltage and the current, the equivalent circuit may be calculated through a learning process.

Further, an abnormality during discharge of the chargeable battery 14 is decided on the basis of $R/R0>Th2$, as illustrated in Step S70. However, in general, the internal resistance increases during discharge. Thus, wrong determination may be made in a case where the value of the discharge current is great. In view of this, the threshold value Th2 may be increased or decreased according to the discharge current. For example, a table storing the discharge current and the threshold value Th2 in association with each other may be prepared, and the threshold value Th2 according to the discharge current may be acquired from the table. Alternatively, $\Delta R/\Delta SOC$ may be calculated, where $\Delta SOC$ represents a change in the state of charge SOC and $\Delta R$ represents a change in the internal resistance R, and the calculated value and a predetermined threshold value Th3 (a threshold value different from the threshold value Th2) may be compared. Specifically, in a case where $\Delta R/\Delta SOC$ is less than the predetermined threshold value Th3 (<0), it may be determined that there is an abnormality. According to such a method, influence caused due to different magnitudes of the charge current can be reduced.

Further, in Step S50 and Step S70, presence or absence of an abnormality is determined on the basis of a magnitude relationship between R/R0 and the threshold value Th1 or Th2. However, presence or absence of an abnormality may be determined on the basis of a magnitude relationship between the value of a difference between R and R0 and the threshold value.

Further, in the above embodiment, in a case where an abnormality is detected, such detection is reported to an ECU (external processor) serving as the higher-level device. However, for example, in a case where a short circuit is detected, such detection is reported to the ECU, and at the same time, the charge may be stopped in order to prevent a large current from flowing from the alternator 15. Further, after a short circuit is detected, it is likely that the engine 16 cannot be restarted. Thus, the ECU may stop execution of idle reduction, or may prompt a driver to visit a maintenance facility, a dealer, a gas station, or the like before the engine 16 stops. Further, in a case where a polarity inversion is detected, the alternator 15 may be controlled to promptly charge the chargeable battery 14 in order to resolve the polarity inversion.

Further, in the above embodiment, the temperature of the electrolytic solution of the chargeable battery 14 is not taken into consideration. However, the temperature of the electrolytic solution may be estimated using the temperature sensor 13, and on the basis of the estimated temperature, the value may be normalized into a value in a standard state. For example, in a case where the temperature of the electrolytic solution estimated using the temperature sensor 13 is 30° C., this estimated value may be normalized into a value at 25° C., which is a standard state, by using a conversion table or the like, for example.

Further, in the above embodiment, presence or absence of an abnormality is decided on the basis of a change in the internal resistance of the chargeable battery 14. However, presence or absence of an abnormality may be decided by also referring to a voltage of the chargeable battery 14 as well as the internal resistance. For example, in a case where the internal resistance changes and a predetermined voltage drop (for example, a voltage drop of approximately 2 V, which is a voltage corresponding to one cell constituting the chargeable battery 14) occurs, it may be determined that there is an abnormality. One example of a method of setting a voltage threshold value indicating occurrence of a voltage drop corresponding to a single cell is a method of calculating a voltage threshold value by using the open circuit voltage. Let n be the number of cells connected in series. The voltage of a battery subject to a voltage drop corresponding to a single cell can be calculated by: Open circuit voltage×(n−1/n). A value obtained by adding the above value to an appropriate margin can be set as the threshold value.

Further, let Ra be a value of the internal resistance at a certain time point at or after a certain time point when it is decided that there is occurrence of an abnormality in the chargeable battery 14, and Rmax be a maximum value of the internal resistance at or after the time point when it is determined that there is occurrence of the abnormality. In a case where a value obtained by dividing Ra by Rmax falls below a predetermined threshold value Th4 (in a case where Ra/Rmax<Th4), it may be determined that the abnormality has been resolved. Specifically, in a case where a short circuit is resolved due to vibration or the like, the internal resistance Ra after the resolution decreases less than the value of the internal resistance Rmax at or after the time point when it is determined that the short circuit occurs. Thus, by determining whether Ra/Rmax<Th4 is satisfied, whether the short circuit has been resolved can be determined. Further, in a case where a polarity inversion is resolved, the value of the internal resistance increases and then decreases in a process of resolution of the polarity inversion, as in the case of occurrence of a polarity inversion. Thus, by determining whether Ra/Rmax<Th4 described above is satisfied, whether the polarity inversion has been resolved can be determined, where Rmax represents a peak resistance value when the internal resistance increases, and Ra represents a value of the internal resistance after the increase. Further, it may be decided that an abnormality has been resolved in a case where the voltage of the chargeable battery 14 increases to reach or exceed a predetermined threshold value (for example, Open circuit voltage×(n−1/n)) after it is decided that the abnormality occurs in the chargeable battery 14.

Further, the flowcharts illustrated in FIG. 9 to FIG. 12 are merely examples, and the present invention is not limited only to the processing of those flowcharts.

REFERENCE SIGNS LIST

1 Chargeable battery abnormality detection apparatus
10 Control unit
10a CPU
10b ROM
10c RAM
10d Communication unit
10e I/F
11 Voltage sensor
12 Current sensor
13 Temperature sensor
14 Chargeable battery
15 Alternator
16 Engine
17 Starter motor
18 Load

The invention claimed is:

1. A chargeable battery abnormality detection apparatus configured to detect an abnormality of a chargeable battery, the chargeable battery abnormality detection apparatus comprising:
 a processor; and
 a memory storing instructions executable by the processor,
 wherein the processor performs the following when executing instructions:
  calculating a value of an internal resistance of the chargeable battery;
  determining whether the chargeable battery is being charged or being discharged;
  determining that an abnormality has occurred in the chargeable battery if either one of the following occurs:
   the calculated value of the internal resistance decreases while the chargeable battery is being discharged; and
   the calculated value of the internal resistance increases while the chargeable battery is being charged; and
  outputting a determination result of the abnormality,
 wherein the processor determines that the chargeable battery has been short-circuited when the calculated value of the internal resistance increases while the chargeable battery is being charged.

2. The chargeable battery abnormality detection apparatus according to claim 1, wherein the processor also determines that the abnormality has occurred in the chargeable battery when the calculated value of the internal resistance increases greater than a value in a normal state of the chargeable battery while the chargeable battery is being discharged.

3. The chargeable battery abnormality detection apparatus according to claim 1,
 wherein the processor determines that a polarity inversion has occurred in the chargeable battery when the calculated value of the internal resistance increases greater than a value in a normal state of the chargeable battery, and subsequently the calculated value of the internal resistance starts decreasing while the chargeable battery is being discharged, and
 wherein the processor determines that a short circuit has occurred when the calculated value of the internal resistance increases greater than a value in a normal state of the chargeable battery, and subsequently the calculated value of the internal resistance does not start decreasing while the chargeable battery is being discharged.

4. The chargeable battery abnormality detection apparatus according to claim 3, wherein the processor determines that the calculated value of the internal resistance increases greater than the value in the normal state of the chargeable battery if a ratio or a difference between the value of the internal resistance at a present time and the internal resistance at a past predetermined time when the chargeable battery was in the normal state exceeds a predetermined threshold value.

5. The chargeable battery abnormality detection apparatus according to claim 3, wherein the processor determines that the calculated value of the internal resistance increases greater than the value in the normal state of the chargeable battery if a value $\Delta R/\Delta SOC$ obtained by dividing $\Delta R$ by $\Delta SOC$ is less than a prescribed negative, where $\Delta R$ represents an amount of increase in the calculated internal resistance R per a predetermined time period, and $\Delta SOC$ is a negative value representing an amount of change in a state of charge SOC per a predetermined time period.

6. The chargeable battery abnormality detection apparatus according to claim 3, wherein after determining that the abnormality has occurred, the processor determines that the abnormality has been resolved if a value obtained by dividing a value of the internal resistance at a certain time point at or after a point in time when the processor determined that the abnormality has occurred in the chargeable battery by a maximum value of the internal resistance at or after the point in time when the processor determined that the abnormality has occurred falls below a predetermined threshold value.

7. The chargeable battery abnormality detection apparatus according to claim 3, wherein after determining that the polarity inversion has occurred, the processor determines that the abnormality of the polarity inversion has been resolved if the calculated value of the internal resistance increases again after the processor has determined that the polarity inversion has occurred and then decreases.

8. The chargeable battery abnormality detection apparatus according to claim 1, wherein the processor calculates the value of the internal resistance by dividing a fluctuating value of a voltage in a predetermined time period by a fluctuating value of a current in the predetermined time period.

9. The chargeable battery abnormality detection apparatus according to claim 1, further comprising a voltage detector that detects a voltage of the chargeable battery,
wherein the processor further determines that the abnormality has occurred in the chargeable battery when the voltage detector detects a voltage drop corresponding to a voltage of one cell among a plurality of cells constituting the chargeable battery.

10. The chargeable battery abnormality detection apparatus according to claim 1, wherein after determining that the abnormality has occurred, the processor determines that the abnormality has been resolved if a voltage of the chargeable battery increases to reach or exceed a predetermined threshold value after the processor has determined that the abnormality has occurred in the chargeable battery.

11. A chargeable battery abnormality detection method of detecting an abnormality of a chargeable battery, the chargeable battery abnormality detection method comprising:
calculating a value of an internal resistance of the chargeable battery;
determining whether the chargeable battery is being charged or being discharged;
determining that an abnormality has occurred in the chargeable battery if either one of the following occurs:
the calculated value of the internal resistance decreases while the chargeable battery is being discharged; and
the calculated value of the internal resistance increases while the chargeable battery is being charged; and
outputting a determination result of the abnormality,
wherein when the calculated value of the internal resistance increases while the chargeable battery is being charged, the method determines that the chargeable battery has been short-circuited.

12. A chargeable battery abnormality detection apparatus configured to detect an abnormality of a chargeable battery, the chargeable battery abnormality detection apparatus comprising:
a processor; and
a memory storing instructions executable by the processor,
wherein the processor performs the following when executing instructions:
calculating a value of an internal resistance of the chargeable battery;
determining whether the chargeable battery is being charged or being discharged;
determining that an abnormality has occurred in the chargeable battery if either one of the following occurs:
the calculated value of the internal resistance decreases while the chargeable battery is being discharged; and
the calculated value of the internal resistance increases while the chargeable battery is being charged; and
outputting a determination result of the abnormality,
wherein the processor determines that a polarity inversion has occurred in the chargeable battery when the calculated value of the internal resistance increases greater than a value in a normal state of the chargeable battery, and subsequently the calculated value of the internal resistance starts decreasing while the chargeable battery is being discharged, and
wherein the processor determines that a short circuit has occurred when the calculated value of the internal resistance increases greater than a value in a normal state of the chargeable battery, and subsequently the calculated value of the internal resistance does not start decreasing while the chargeable battery is being discharged.

13. The chargeable battery abnormality detection apparatus according to claim 12, wherein the processor determines that the calculated value of the internal resistance increases greater than the value in the normal state of the chargeable battery if a ratio or a difference between the value of the internal resistance at a present time and the internal resistance at a past predetermined time when the chargeable battery was in the normal state exceeds a predetermined threshold value.

14. The chargeable battery abnormality detection apparatus according to claim 12, wherein the processor determines that the calculated value of the internal resistance increases greater than the value in the normal state of the chargeable battery if a value $\Delta R/\Delta SOC$ obtained by dividing $\Delta R$ by $\Delta SOC$ is less than a prescribed negative, where $\Delta R$ represents an amount of increase in the calculated internal resistance R per a predetermined time period, and $\Delta SOC$ is a negative value representing an amount of change in a state of charge SOC per a predetermined time period.

15. The chargeable battery abnormality detection apparatus according to claim 12, wherein the processor calculates the value of the internal resistance by dividing a fluctuating value of a voltage in a predetermined time period by a fluctuating value of a current in the predetermined time period.

16. The chargeable battery abnormality detection apparatus according to claim 12, further comprising a voltage detector that detects a voltage of the chargeable battery,
wherein the processor further determines that the abnormality has occurred in the chargeable battery when the voltage detector detects a voltage drop corresponding to a voltage of one cell among a plurality of cells constituting the chargeable battery.

17. The chargeable battery abnormality detection apparatus according to claim 12, wherein after determining that the abnormality has occurred, the processor determines that the abnormality has been resolved if a value obtained by dividing a value of the internal resistance at a certain time point at or after a point in time when the processor determined that the abnormality has occurred in the chargeable battery by a maximum value of the internal resistance at or after the point in time when the processor determined that the abnormality has occurred falls below a predetermined threshold value.

18. The chargeable battery abnormality detection apparatus according to claim 12, wherein after determining that the polarity inversion has occurred, the processor determines that the abnormality of the polarity inversion has been resolved if the calculated value of the internal resistance increases again after the processor has determined that the polarity inversion has occurred and then decreases.

19. The chargeable battery abnormality detection apparatus according to claim 12, wherein after determining that the abnormality has occurred, the processor determines that the abnormality has been resolved if a voltage of the chargeable battery increases to reach or exceed a predetermined threshold value after the processor has determined that the abnormality has occurred in the chargeable battery.

* * * * *